United States Patent [19]
Hiller

[11] Patent Number: 5,134,399
[45] Date of Patent: Jul. 28, 1992

[54] SUBRANGING ANALOG-TO-DIGITAL CONVERTER WITH DITHER

[75] Inventor: Donald R. Hiller, Lake Stevens, Wash.

[73] Assignee: Hewlett-Packard Company, Palo Alto, Calif.

[21] Appl. No.: 593,441

[22] Filed: Oct. 5, 1990

[51] Int. Cl.[5] ............................................. H03M 1/20
[52] U.S. Cl. ................................. 341/131; 341/118
[58] Field of Search ............... 341/131, 155, 156, 163, 341/120, 118, 899, 143

[56] References Cited
U.S. PATENT DOCUMENTS 4,550,309 10/1985 Hiller et al. ............................ 341/131
4,814,767 3/1989 Fernandes et al. .................. 341/158
4,903,023 2/1990 Evans et al. ..................... 341/118 X

*Primary Examiner*—A. D. Pellinen
*Assistant Examiner*—Sharon D. Logan

[57] ABSTRACT

Noise (dither) is introduced into a subranging analog-to-digital converter to enhance conversion accuracy. The resolution of the noise is sufficiently fine that its least significant bits can be changed without always changing the second pass approximation from the converter's internal analog-to-digital converter. Additional bits of statistical resolution can thereby be achieved without sacrificing the overlap between the dither word and the first pass digital approximation that is needed to provide dithered error correction.

10 Claims, 2 Drawing Sheets

SUBRANGING ANALOG-TO-DIGITAL CONVERTER WITH DITHER

FIELD OF THE INVENTION

The present invention relates to subranging analog-to-digital converters employing dither to improve resolution accuracy, and more particularly relates to such converters wherein the dither is resolved to bits that are nominally insignificant with respect to the converter's internal ADC.

BACKGROUND AND SUMMARY OF THE INVENTION

Subranging analog-to-digital converters (also known as residue converters) are well known in the art, as shown by U.S. Pat. Nos. 3,597,761, 3,956,746, 4,550,309 and 4,733,217.

U.S. Pat. No. 4,550,309 shows a residue converter in which resolution is enhanced by introducing a random dither signal into the process. Referring to FIG. 1, the apparatus 10 disclosed in U.S. Pat. No. 4,500,309 includes a sample and hold circuit 12, first pass and second pass scaling circuits 14, 16, an 8-bit analog-to-digital (ADC) converter 18, a digital-to-analog converter (DAC) 20, an analog difference circuit 22, a 13-bit accumulator 24, and a 13-bit latch 26. To these foregoing elements (which are conventional in any subranging converter) are added a digital noise source 28, a second 13-bit accumulator 30, and a second 13-bit latch 32.

In operation, the converter 10 operates by first scaling an analog input signal by a factor of K in scaling circuit 14. The scaled analog input signal is then converted into a first pass 8-bit digital word approximately corresponding thereto by the ADC 18. The first pass output from ADC 18 is loaded into the 8 most significant bits of the 13-bit second accumulator 30. A 6-bit digital noise word from noise source 28 is loaded into the least significant bits of this accumulator, forming a one-bit overlap with the ADC output word. The composite, accumulated value of these data words is latched by the latch circuit 32 and loaded into the output accumulator 24.

The accumulated word latched into the latch 32 is converted into analog form by the DAC 20. This analog signal is subtracted from the input analog signal by the analog subtraction circuit 22. The result of this subtraction, termed an analog residue signal, is provided to the second pass scaling circuit 16.

In the second pass conversion, the 8-bit output word from the ADC 18 corresponding to the scaled residue signal is loaded into the 8 least significant bits of the output accumulator 24 and accumulated with the 13-bit composite word that was loaded during the first pass. The dither component of the composite word is an error term that is reflected (negatively) in the analog residue signal converted in the second pass. The second pass conversion, when accumulated with the first pass composite word, thus operates to cancel the dither error. The output from the accumulator 24 is latched by the latch circuit 26 and provides the final digital output signal.

In the illustrated system, the first pass scaling circuit 14 has a gain K of 0.125. The second pass scaling circuit 16 has a gain L of 4. Thus, it will be recognized that the analog signal applied to the ADC 18 in the second pass is amplified by a factor of 32 relative to the first pass. This yields five additional bits of conversion resolution and three bits of overlap. (Overlap refers to the fact that the second pass 8-bit output of the ADC 18 is shifted 5 bits from the first pass output to provide 13-bit "resolution" or sensitivity of the final output digital signal representing the input analog signal.) The three least significant bits of the first pass conversion thus overlap and are combined with the three most significant bits of the second pass conversion. (Of course, the five most significant bits of the first pass conversion may also be affected if there is carryover from combining overlapped bits.)

The manner by which the dithering operation improves the overall ADC linearity may be understood by assuming that an input signal varies slowly in the vicinity of a value for which the ADC exhibits a significant jump or discontinuity. That is, the ADC produces a value which differs by a full bit from the previous signal. Further, the ADC may exhibit hysteresis, i.e., successive conversions from slowly increasing signals may not match those from slowly decreasing signals. Dithering reduces the deleterious effect of such ADC anomalies by producing, for a given value of input signal, a sequence of conversions derived from a *neighborhood* around that signal value. Particular conversion errors are thus randomized. Erroneous conversions from ADC anomalies may then be averaged with correct conversions, and the effect of the anomalies is diluted.

The amount of error that can be corrected by dither is related to the amount of overlap between the first and second pass conversions. As noted, the ADC 18 resolves eight bits, so the overlap between passes is three bits. That is, the lower three bits of the first pass conversion have the same weight as the upper three bits of the second pass conversion. Another way of interpreting this is that the magnification in the second pass conversion is 32 (the ratio between the gain of the second scaling circuit 16 to the gain of the first scaling circuit 18), or the equivalent of a 5-bit shift in position (rather than eight, which would be the case if there were no overlap). Due to this overlap, the second pass conversion can resolve errors in the first pass of up to eight times (three bits of position—the overlap) the weight of the least significant bit of the first pass. This overlap permits the error reducing dither signal to be introduced.

Another way of looking at the second pass conversion and its overlap is that the first pass conversion (which is loaded into the DAC 20 for the second pass) contains inaccuracies. These can be errors in the first pass conversion, but in the case of dither, they are deliberately added. If the DAC 20 is highly linear, the second pass conversion resolves the inaccuracies and they subtract in the final accumulator 24 (the sign through the DAC signal path is negative). The amount of overlap determines the size of errors, including dither, that can be tolerated in the first pass conversion.

To increase resolution, the obvious solution is reduce the overlap. This requires that the dither also be reduced, reducing the performance advantages it offers. Alternatively, the resolution of both the ADC 18 and the DAC 20 could be increased.

To obtain 16 bit resolution (instead of 13), the overlap would have to be reduced to zero, entirely eliminating the dither and error correction.

It is interesting to note that in the FIG. 1 system, each bit of the dither word has a direct effect on the output from ADC 18 in the second pass conversion. Taking the most extreme example, the least significant bit of the dither word is the 13th (and least significant) bit of the composite signal latched by the latch 32. This signal is converted into analog form by converter 20. When this analog output signal is converted into a residue signal, it is, as noted earlier, amplified by a factor of 32 or $2^5$, relative to the first pass. This gain causes the least significant bit of the 13-bit composite word (the noise LSB) effectively to be shifted 5 bits to the left. In so doing, it becomes the least significant bit of the 8-bit second pass data word output by the ADC 18. Put another way, a change in the least significant bit of the digital noise word is reflected as a change in the least significant bit of ADC 18 in the second pass conversion word produced by the ADC 18.

In a converter according to the present invention, the preceding is not the case. One or more of the least significant bits of the digital noise word are of such fine bit-resolution that, even after scaling, they are still not large enough to always change the least significant bit of the ADC 18 when producing the second pass conversion.

While such an extension of the original dithering technology is counter intuitive and may seem to have no effect, in fact it has an advantageous effect. Namely, the 13th bit of converter resolution statistically varies between one and zero in accordance with these additional bits of resolution that are not directly reflected in the output of ADC 18. By this arrangement, additional resolution is achieved without sacrificing the advantageous error correction afforded by overlap.

The foregoing and additional features and advantages of the present invention will be more readily apparent from the following detailed description, which proceeds with reference to the accompanying drawings.

DETAILED DESCRIPTION OF A PREFERRED EMBODIMENT

Figure 2:
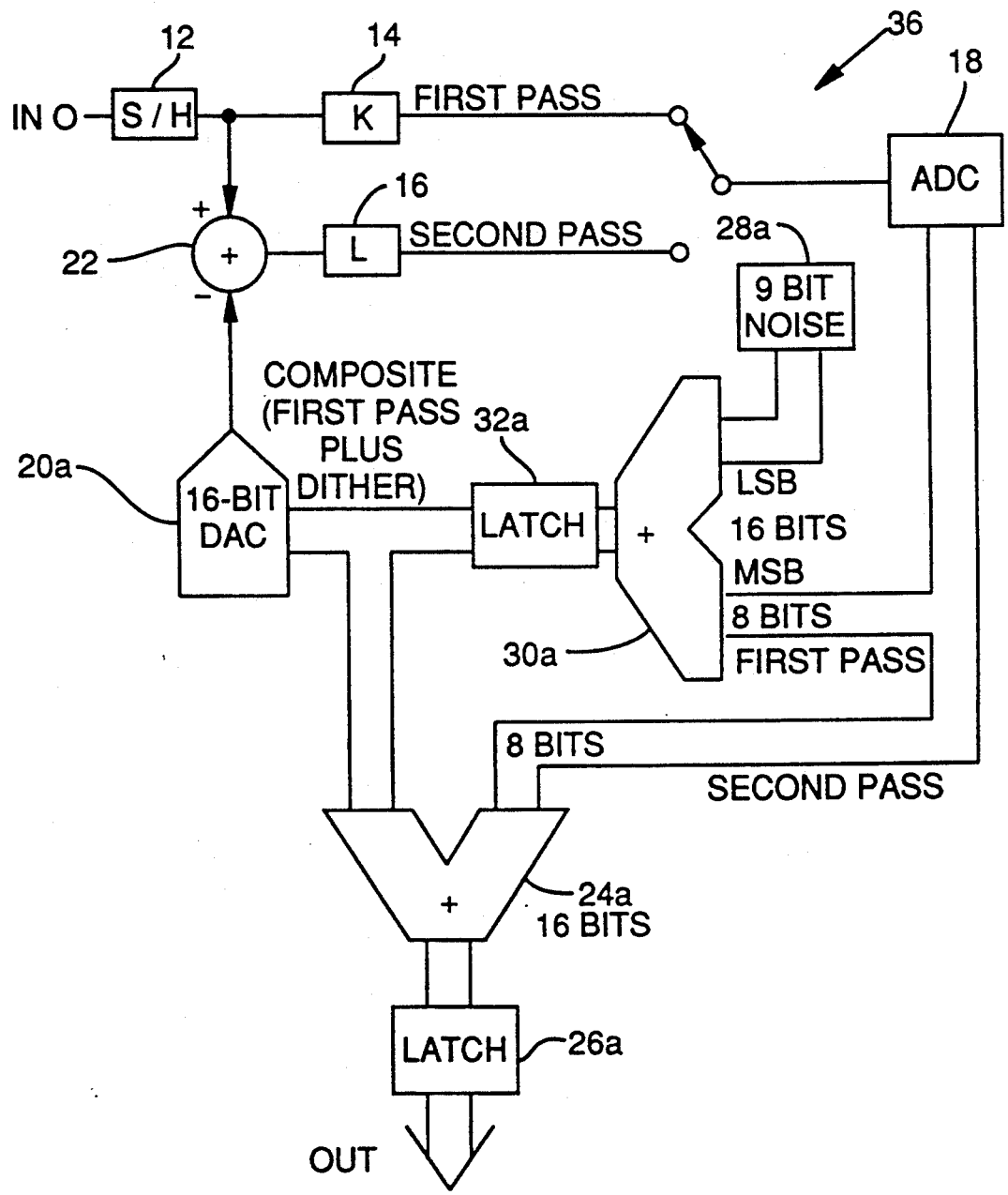
FIG. 2 is a block diagram of a dithered residue converter according to one embodiment of the present invention.

Referring to FIG. 2, it will be seen that a dithered residue converter 36 according to the present invention uses basically the same apparatus as the prior art converter 10, but employs a different methodology. The crux of the difference is that the noise source 28a produces noise words of sufficiently fine resolution that the second pass conversion from the ADC 18 does not always change with a change in the least significant bits of the dither word. The resolution of the DAC 20a is extended from 13 bits to 16, but the resolution of the ADC 18 remains at 8 bits.

Figure 1:
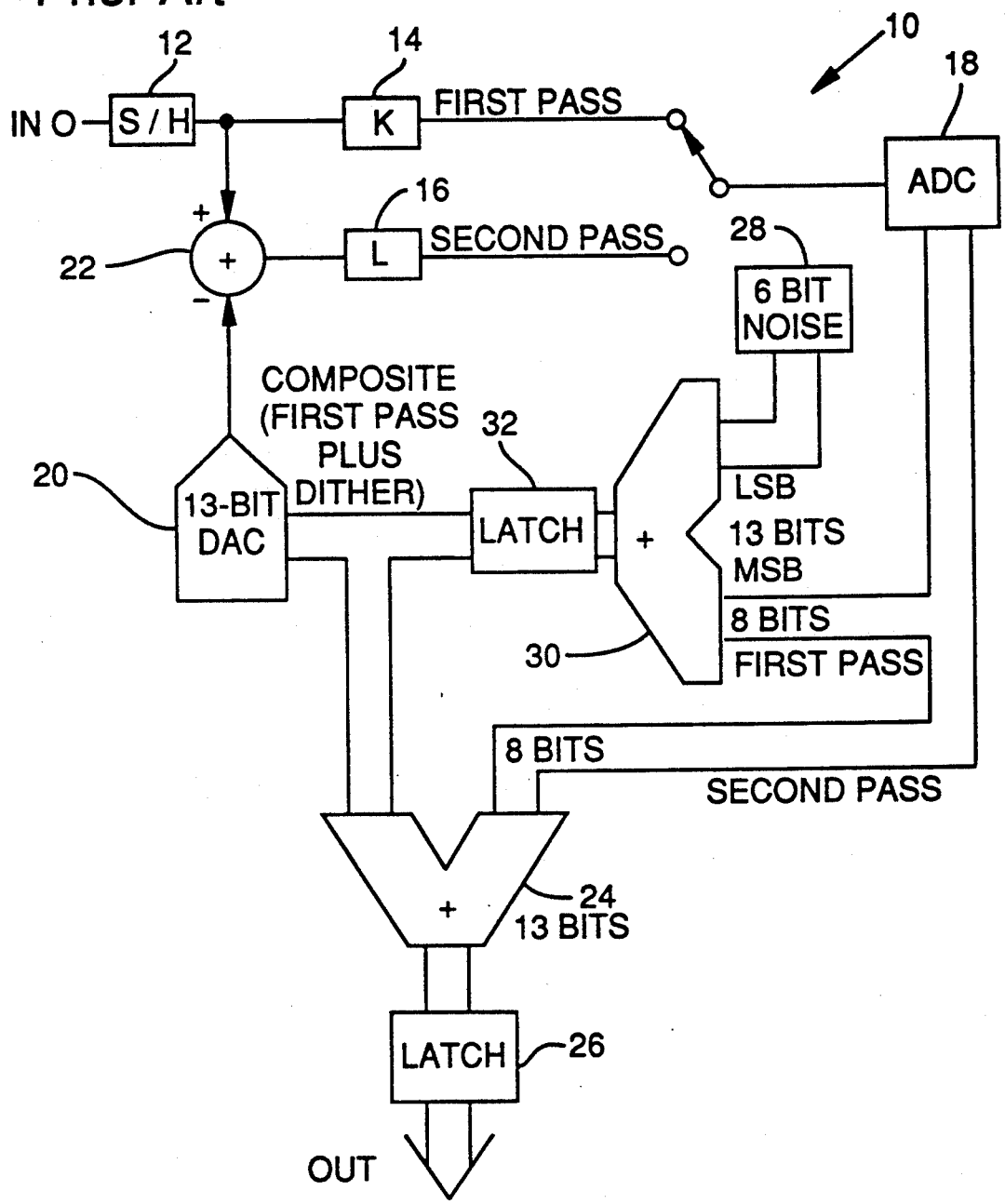
FIG. 1 is a block diagram of a dithered residue converter according to the prior art.

In the illustrated form of the invention, the dither word comprises nine bits. The accumulators 24a, 30a and latches 32a, 26a are 16-bit devices to accommodate the enhanced resolution provided by the illustrated form of the invention. The first pass output from the 8-bit ADC 18 is justified into the eight most significant bits of the accumulator 30. A nine bit noise word is justified into the least significant bits of this accumulator. As in the FIG. 1 system, the most significant of the noise word overlaps with the least significant bit of the first pass conversion in this accumulator. The remaining eight bits of the noise word do not overlap. The resultant 16-bit word is loaded into the latch 32a and the output accumulator 24a.

The 16-bit word latched into the latch 32a is converted into analog form by the 16-bit DAC 20a. The residue signal output by the difference circuit 22 is again amplified by a factor of 32 (relative to the first pass). Accordingly, the five most significant non-overlapped bits of the dither word are amplified in significance to the point that they fall within the 8-bit resolution of the ADC 18 in the second pass. However, the three least significant bits of the noise word, *even after this amplification*, still are insufficient to always toggle even the least significant bit of the converter 18 in the second pass conversion. These three bits, however, bias the result of the second pass ADC conversion, allowing the whole converter to resolve smaller levels than one count of the second pass ADC conversion when the three new dither bits are added in, as detailed below.

The 8-bit word produced by the ADC 18 in the second pass is loaded into the output accumulator 24a. However, unlike the prior art converter 10 of FIG. 1, this second pass word is not justified into the accumulator's least significant bits. Rather, this word is offset from the accumulator's least significant bit by the number of noise bits that are insufficient to toggle the ADC 18. In the illustrated system, there are three such bits, so the least significant bit of the second pass conversion is justified into the accumulator so that its least significant bit is aligned with the accumulator's fourth least significant bit.

To illustrate the advantageous biasing effect produced by the lowest order noise bits, consider an input signal supplied to the converter that yields a first pass conversion output signal from ADC 18 of 00000000. Further, ignore (set to zero) the dither that is $\geq 1$ count (LSB) of the second pass ADC conversion (upper 6 bits), considering only the new, 3 LSBs of dither. Suppose that the input is the equivalent to 000000000000+⅛ (or 0000000000000001=9, extended to 16 bits). The bottom 3 bits (LSBs) of the DAC 20a are dithered with equal probability so each of the eight possible codes is equally likely, with a probability of ⅛.

In the 13 bit case, the output code would be 0000000000001, or 0000000000001000=8 when extended to 16 bits. However, the next lower increment of the 13 bit conversion would be 0000000000000000, extended to 16 bits, so the input is only bracketed between 0 and 8, 13 bit resolution.

In this 16-bit design, with input equivalent to 9, the statistical outputs are as set forth in Table I:

TABLE I

| DAC LSBs | ADC | Probability | Output Code | counts | compared to 5 |
|---|---|---|---|---|---|
| 000 | 00000001 | ⅛ | 0000000000001000 | 8 | > |
| 001 | 00000001 | 1/16 | 0000000000001001 | 9 | > |
| 001 | 00000000 | 1/16 | 0000000000000001 | 1 | < |
| 010 | 00000000 | ⅛ | 0000000000000010 | 2 | < |
| 011 | 00000000 | ⅛ | 0000000000000011 | 3 | < |
| 100 | 00000000 | ⅛ | 0000000000000100 | 4 | < |
| 101 | 00000000 | ⅛ | 0000000000000101 | 5 | = |
| 110 | 00000000 | ⅛ | 0000000000000110 | 6 | > |
| 111 | 00000000 | ⅛ | 0000000000000111 | 7 | > | probability weighted average = 5

A special case is when the dither is 001. Subtracting the dither (of value 1) from the input signal (of value 9) results in an ADC input of value 8, which is exactly one count of the ADC. This places the ADC exactly on the threshold of the 00000000 to 00000001 transition. Since either ADC state is equally likely, the foregoing table reflects 1/16 probability for each value. If the dither is greater than one count, then the ADC sees an input of less than a value of 8 and so always produces a conversion of 00000000. (A larger dither corresponds to a smaller residue due to the signal path through the analog difference circuit 22.) If the dither is less than one of its counts, then the ADC sees an input greater than a value of 8 and so always produces 00000001.

The average output code is 5. This is biased 4 counts (½ count of the second pass ADC conversion) below the actual input, equivalent to 9 counts. (If the equivalent input had been 12, the average would have been 8, etc.) Since this bias is fixed, it can be subtracted out if needed.

It will be noted that the output code is greater than 5 as much as it is less than 5. Consequently, a check of this converter with a tracking loop to determine the input threshold for each of its 16-bit output codes yields results that are indistinguishable from those produced with a conventional 16-bit converter.

The difference between the present invention and the prior art can be quantified mathematically. Let:
$N_1$ be the resolution of the ADC 18 on the first pass;
$N_2$ be the resolution of the ADC 18 on the second pass;
K be the first pass analog scaling factor;
L be the second pass analog scaling factor;
M be the number of bits in the digital noise words;
P be the number of bits in the composite first pass-/dither word (and, in this example, the number of bits in the final output word);
then the number of bits, X, of the M-bit noise word that are too fine to be reflected in the second pass output of the ADC 18 can be computed as follows:

$$X = P - N_2 - \log_2(L/K)$$

The values of these parameters in the prior art converter 10 and the illustrative converter 36 of the present invention are as set forth in Table II:

TABLE II

|       | PRIOR ART | CONVERTER 36 |
|-------|-----------|--------------|
| $N_1$ | 8         | 8            |
| $N_2$ | 8         | 8            |
| K     | .125      | .125         |
| L     | 4         | 4            |
| M     | 6         | 9            |
| P     | 13        | 16           |
| X     | 0         | 3            |

From the foregoing, it can be seen that the present invention may be characterized as any in which the value of X is greater than 0. In the illustrated embodiment, the value of X is three, indicating that three bits of the noise word are too finely resolved to be reflected in the second pass output of the ADC 18. In such an embodiment, 16-bit accuracy can be obtained with an 8-bit ADC without sacrificing the error correcting benefits of dither.

Having described and illustrated the principles of my invention with reference to an illustrative embodiment, it will be recognized that the invention can be modified in arrangement and detail without departing from such principles. For example, while the invention has been illustrated with reference to a two-pass converter, the principles thereof are readily applicable to any multipass converter.

In view of the many possible embodiments to which the principles of my invention may be put, it should be recognized that the detailed embodiment is illustrative only and should not be taken as limiting the scope of my invention. Rather, I claim as my invention all such embodiments as may come within the scope and spirit of the following claims and equivalents thereto.

I claim:

1. In a multi-pass analog-to-digital conversion method that includes introducing an M-bit dither word into a first digital approximation, producing an analog residue signal from said approximation, and using an analog-to-digital converter to produce a second digital approximation from the residue signal, an improvement comprising the step of toggling the least significant bit of M-bit dither word without changing any bits of the second digital approximation.

2. The method of claim 1 which further includes the step of changing the two least significant bits of the M-bit dither word without changing any bits of the second digital approximation.

3. The method of claim 1 which further includes the step of changing the three least significant bits of the M-bit dither word without changing any bits of the second digital approximation.

4. A method of analog-to-digital conversion comprising the steps:
   scaling an analog input signal by a factor of K;
   converting the scaled analog input signal into an $N_1$-bit digital word approximately corresponding thereto;
   providing a pseudo-random signal comprised of M-bit digital noise words;
   justifying the $N_1$-bit digital word as the most significant bits of a P-bit digital word;
   justifying one of the M-bit digital noise words as the least significant bits of the P-bit word and summing said justified M-bit digital noise word with said justified $N_1$-bit word to produce a composite P-bit word with dither;
   producing an analog signal corresponding to the P-bit word;
   subtracting the analog signal corresponding to the P-bit word from the input analog signal to yield an analog residue signal;
   scaling the analog residue signal by a factor of L, where the ratio L/K is an integral power of two;
   converting the amplified analog residue signal into a $N_2$-bit digital word approximately corresponding thereto;
   justifying the P-bit word as the most significant bits of an output word;
   justifying the $N_2$-bit digital word so the least significant bit thereof occupies bit $X+1$ of the output word, and summing said justified $N_2$-bit word with said justified P-bit word to produce a composite output word;
   wherein:

$$X = P - N_2 - \log_2(L/K), \text{ and } X \geq 1.$$

5. The method of claim 4 in which $X=3$.

6. The method of claim 5 in which $P=16$, $N_2=8$, and $\log_2(L/K)=5$.

7. The method of claim 6 in which $M=9$.

8. An analog-to-digital converter comprising:
   an input for receiving an input analog signal;

first scaling means coupled to the input for scaling the input analog signal by a factor of K to produce a scaled analog input signal;

an analog-to-digital converter coupled to the first scaling means for converting the scaled analog input signal into an N-bit digital word approximately corresponding thereto;

a noise source of M-bit digital noise words;

a first P-bit accumulator having inputs coupled to the noise source and to the analog-to-digital converter;

a P-bit latch circuit coupled to an output of the P-bit accumulator;

a digital-to-analog converter for converting an output signal from the latch into an analog signal corresponding thereto;

a subtraction circuit for subtracting the analog signal from the digital-to-analog converter from the input analog signal to yield an analog residue signal;

second scaling means coupled to the subtraction circuit for scaling the analog residue signal by a factor of L, where the ratio L/K is an integral power of two, said second scaling means having an output coupled to the analog-to-digital converter;

a second P-bit accumulator having a first input connected to the analog-to-digital converter and having a second input connected to the P-bit latch circuit;

wherein:

$$P - N - log_2(L/K) \leq 1.$$

9. In a multi-pass analog-to-digital conversion method, wherein output bits of first and second conversion passes overlap, that includes using an analog-to-digital converter to produce a first $N_1$-bit digital approximation from an input signal in a first pass, summing an M-bit dither word with the first $N_1$-bit digital approximation to yield a P-bit intermediate result, producing an analog residue signal from said intermediate result, amplifying the analog residue signal by 2K relative to the first pass where $k < N_1$, using an analog-to-digital converter to produce a second $N_2$-bit digital approximation from the amplified residue signal, and combining the second $N_2$-bit digital approximation with P-bit intermediate result to yield a Q-bit final output word, an improvement wherein one or more of least significant bits of the M-bit dither word are of such fine resolution that, despite the bit overlap, $Q = N_1 + N_2$, where $N_1$, $N_2$, M, P and Q are integers.

10. The method of claim 9 in which $Q = P$.

* * * * *